United States Patent
Keigler

(10) Patent No.: US 6,174,011 B1
(45) Date of Patent: Jan. 16, 2001

(54) METHOD OF AND APPARATUS FOR HANDLING THIN AND FLAT WORKPIECES AND THE LIKE

(76) Inventor: Arthur Keigler, 20 PinePlain Rd, Wellesley, MA (US) 02481

( * ) Notice: Under 35 U.S.C. 154(b), the term of this patent shall be extended for 0 days.

(21) Appl. No.: 09/291,668

(22) Filed: Apr. 14, 1999

(51) Int. Cl.$^7$ .............................. B25J 15/10; B65G 49/07
(52) U.S. Cl. ........................ 294/99.1; 294/1.1; 414/941
(58) Field of Search .................................. 294/1.1, 16, 33, 294/99.1, 99.2, 103.1, 93; 414/941; 269/224, 254 R; 81/64

(56) References Cited

U.S. PATENT DOCUMENTS

| | | | |
|---|---|---|---|
| 4,311,427 | * 1/1982 | Coad et al. ........................ | 294/99.1 |
| 4,410,209 | * 10/1983 | Trapani ............................ | 414/941 |
| 4,858,980 | * 8/1989 | Dreisig ............................ | 294/99.1 |
| 4,944,650 | * 7/1990 | Matsumoto ...................... | 414/941 |
| 5,484,252 | * 1/1996 | Mutoh ............................. | 414/941 |

* cited by examiner

Primary Examiner—Dean J. Kramer
(74) Attorney, Agent, or Firm—Rines and Rines

(57) ABSTRACT

A novel technique and apparatus for receiving, holding and/or transporting thin planar workpieces and the like that involves radially supporting circumferentially spaced thin and flexible annular ring sectors about a fixed planar central circular disc upon which the workpiece is to be received, and by limitedly rotationally bending the ring sectors about the disc, causing circumferential leaf springs bridging the successive ring sectors and carrying workpiece holding fingers to deform and thereby expand (or retract) the radial position of the fingers to accommodate the edges of the workpiece.

25 Claims, 11 Drawing Sheets

METHOD OF AND APPARATUS FOR HANDLING THIN AND FLAT WORKPIECES AND THE LIKE

FIELD OF INVENTION

The present invention relates to techniques and apparatus for holding, handling and transporting thin workpieces; being more specifically concerned with flat pieces such as semiconductor wafers, magnetic recording discs, flat panel displays and other thin and flat workpieces, particularly, though not exclusively, as they may be handled and transported between workstations or wafer cassettes and the like.

BACKGROUND OF INVENTION

The art is replete with many types of such handling mechanisms, including apparatus specifically designed for holding workpieces like semiconductor wafers, and transporting them between workstations and or wafer cassettes. Among these are mechanisms using an annular ring member to position a wafer and an annular flange or lip to support the workpieces, as suggested, for example, in U.S. Pat. No. 4,584,045, as part of a dry processing system. U.S. Pat. No. 4,749,330 discloses a simpler version of such a means, eliminating the annular positioning ring. In U.S. Pat. No. 5,334,257, as another example, a paddle works in conjunction with a means to lift the workpiece off a fixed annular ring member. U.S. Pat. Nos. 5,584,647 and 5,810,549 disclose such workpiece holding means as an object handling system.

A disadvantage of these and similar approaches, however, is that the workpiece is not held in a manner that secures the workpiece when the gripper is moved in planes other than horizontal. Another disadvantage is that such apparatus is restricted to picking the workpiece up off a pedestal of some sort, and does not allow for picking the workpiece up off a flat surface, or for picking up the workpiece from above.

A different approach has accordingly been suggested, using a vacuum wand or paddle, wherein a flat upper surface with vacuum ports is brought into contact with the underside of a workpiece and suction is applied at the port to secure the workpiece tot he paddle. U.S. Pat. No. 4,770,590 discloses such a means for use in a transport system. U.S. Pat. Nos. 5,064,030, 5,135,349 and 5,765,444 disclose such a means for use in a precision robot arm system. U.S. Pat. No. 5,803,979 discloses a means of making vacuum workpiece holders more robust against contamination of the workpiece that may clog the vacuum lines. A basic disadvantage of this vacuum approach, however, is that the contact between the paddle and the workpiece can result in microscopic mechanical damage to the workpiece or particle contamination of the workpiece. As microelectronic circuitry evolves to smaller features and higher densities, particle contamination even of the backside of workpieces is undesirable. This technique, furthermore, prohibits picking up the workpiece from its front surface, the surface on which micro-electronic circuits are fabricated.

Another prior art proposal for holding workpieces is the use of a plurality of gripping arms or fingers which are mechanically moved relative to one other to change the distance between contact surfaces which, when brought to their minimal separation, clamp the workpiece in place relative to the arm assembly. These means avoid the previously discussed disadvantage of contacting the work-piece surface, and can be used to pick up a work-piece from a substantially flat surface. U.S. Pat. No. 4,900,214 is illustrative of such proposals, disclosing first and second jaws moveable relative to one other along a diameter of the wafer to be transported. In U.S. Pat. Nos. 5,549,444 and 5,700,046, contacting elements are attached to the inner surface of each gripping member in order to support the workpiece from its bottom surface. U.S. Pat. No. 5,566,466 discloses such a means wherein the gripper mechanism is part of a spindle assembly used to rotate the workpiece while it is clamped by the mechanism.

A disadvantage of such approaches resides in the possibility of particle generation by rubbing between adjacent sliding mechanical surfaces. A further disadvantage is the cost of fabricating and maintaining precision tolerances in an assembly of several parts.

The matter of handling a variety of workpiece sizes has also been considered. U.S. Pat. No. 4,971,512, as an illustration, discloses the use of a fork-shaped workpiece support board that carries the workpiece from the bottom with a moveable arm slide provided to capture the workpiece in its horizontal plane. While such constructions are indeed capable of handling a variety of workpiece sizes, they are unfortunately not useful in applications where workpiece cleanliness on front and back sides is important.

Still another approach to solve these pressing problems makes us of a Bernoulli effect on the top side of the workpiece. U.S. Pat. Nos. 5,080,549 and 5,324,155 disclose such a system wherein a paddle with appropriately placed gas exhaust ports is brought into close proximity with the top side of a workpiece. The exhaust ports are configured so that the gas flow creates a low pressure region on the top side of the workpiece causing it to lift up toward said paddle. The workpiece can therefore be lifted from a substantially flat surface and transported from the top side with no contact with the top side of the workpiece.

A disadvantage of this approach, however, is that it may not be used in a vacuum system. A further disadvantage is that it does not provide for high precision centering of the workpiece; and still another disadvantage in that the holding mechanism restricts the transport motion to paths within a horizontal plane or perpendicular to a horizontal plane.

OBJECTS OF THE INVENTION

It is accordingly an object of the present invention to provide a new and improved method of apparatus for handling substantially thin flat workpieces and the like in a manner that provides for repeatable transport of said workpieces between-different locations in a process tool and for repeatable precise location of said workpieces in said locations, and obviating the above-described and other disadvantages and limitations in prior art approaches.

It is a further object to provide a novel handling mechanism that is itself thin in the same dimension as the workpiece is thin, and thereby enables extracting and inserting the workpieces from substantially closed pack configurations, such as wafer cassettes or diffusion tube racks and the like.

Another object is to provide an improved holding mechanism that has no sliding contacting surfaces that may be a source of particle generation and that could contaminate the workpiece; preferably, indeed, contacting the workpiece at its very extreme edges and avoiding contact with either the front or rear surface of the said workpiece, thereby insuring workpiece cleanliness. This structure is sometimes referred to herein as an "end-effector."

Still a further object of the invention to provide a handling mechanism that automatically and reliably brings the workpiece into a known location relative to the robotic arm to which the mechanism is attached—known with respect to both the mechanical center of the workpiece and the rotational orientation of the workpiece as defined by a location notch or location flat in the case of semiconductor wafer workpieces. This repeatable centering allows the robotic arm repeatedly to position said workpiece in a centered location in processing equipment, such as a spin chuck or a diffusion rack.

The invention has the additional object of providing for a minimal number of parts, and especially a minimal number of moving parts, in order to enhance the reliability of the said mechanism continually to transport and position millions of workpieces.

Another object of the invention to provide a novel mechanism that is also suitable for transporting workpieces from one configuration within an automated process tool to another configuration within said process tool with minimal constraint on the path along which the robot arm travels. An embodiment of the invention is provided that securely holds the workpiece in any orientation with respect to the vertical and horizontal planes of the process tool.

The invention additionally provides for holding a workpiece during operations requiring rotation of the workpiece, and at high speeds (thousands of rotations per minute), holding the workpiece precisely on center with the axis of rotation of a shaft to which the mechanism is attached, and enabling the workpiece to be reliably inserted into and retrieved out of the mechanism when the workpiece and shaft are not rotating.

Finally, it is a further object of the invention to provide such a novel handling apparatus that may be fabricated using injection molding methods, providing the additional advantage of low cost embodiments that may be used for manual transport and positioning of workpieces, or embodiments that may be used in environments unsuitable for metal materials.

Other and further objects will be explained hereinafter and are more particularly delineated in the appended claims.

SUMMARY OF THE INVENTION

In summary, the invention embraces a holder for a thin, planar circular workpiece and the like comprising a substantially thin and flexible substantially planar circular sheet having a central circular disc portion surrounded by a concentric annular ring portion, with the ring portion being segmented into successive separated circumferentially spaced ring sectors; structural means interconnecting the respective ring sectors with the corresponding circumferential sectors of the central disc portion, for supporting the same in place therefrom; the ring sectors being peripherally provided with external arcuate leaf springs circumferentially bridging spaced points of adjacent ring sectors to which the ends of the leaf springs are respectively connected, and with an arcuate gap between the sectors and the leaf springs; each leaf spring intermediately carrying a radially protruding holder finger for receiving and contacting an edge region of a circular workpiece to be placed on the holder; and means operable while the central disc portion is held fixed, for flexibly rotationally bending the ring sector to move limitedly circumferentially relative to the central disc portion to cause beam-like deflections of the structural means and ring sectors that correspondingly radially distort the leaf springs and bow their gaps, radially extending and retracting the positions of the fingers carried by the leaf springs to enable insertion and removal of the workpiece.

Preferred and best mode designs and techniques will now be explained in detail.

BRIEF DESCRIPTION OF THE DRAWINGS

The invention will now be explained in connection with the accompanying drawings, wherein FIG. 1. is a plan view of the preferred embodiment of the end-effector construction of the invention, shown with a workpiece wherein the workpiece is clamped in place by the end-effector.

DETAILED DESCRIPTION OF A PREFERRED EMBODIMENT OF THE INVENTION

Figure 1:
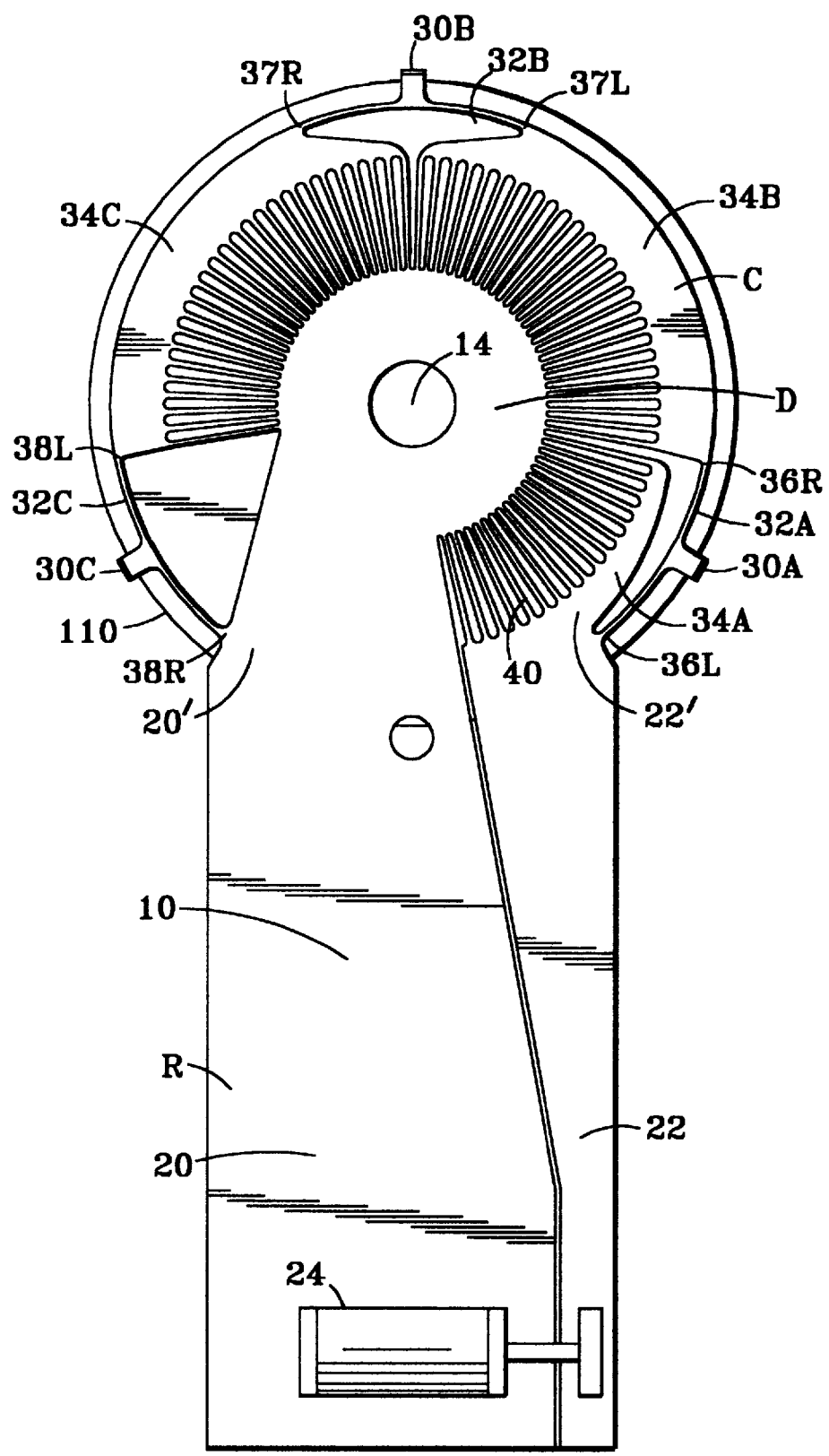
Figure 2:
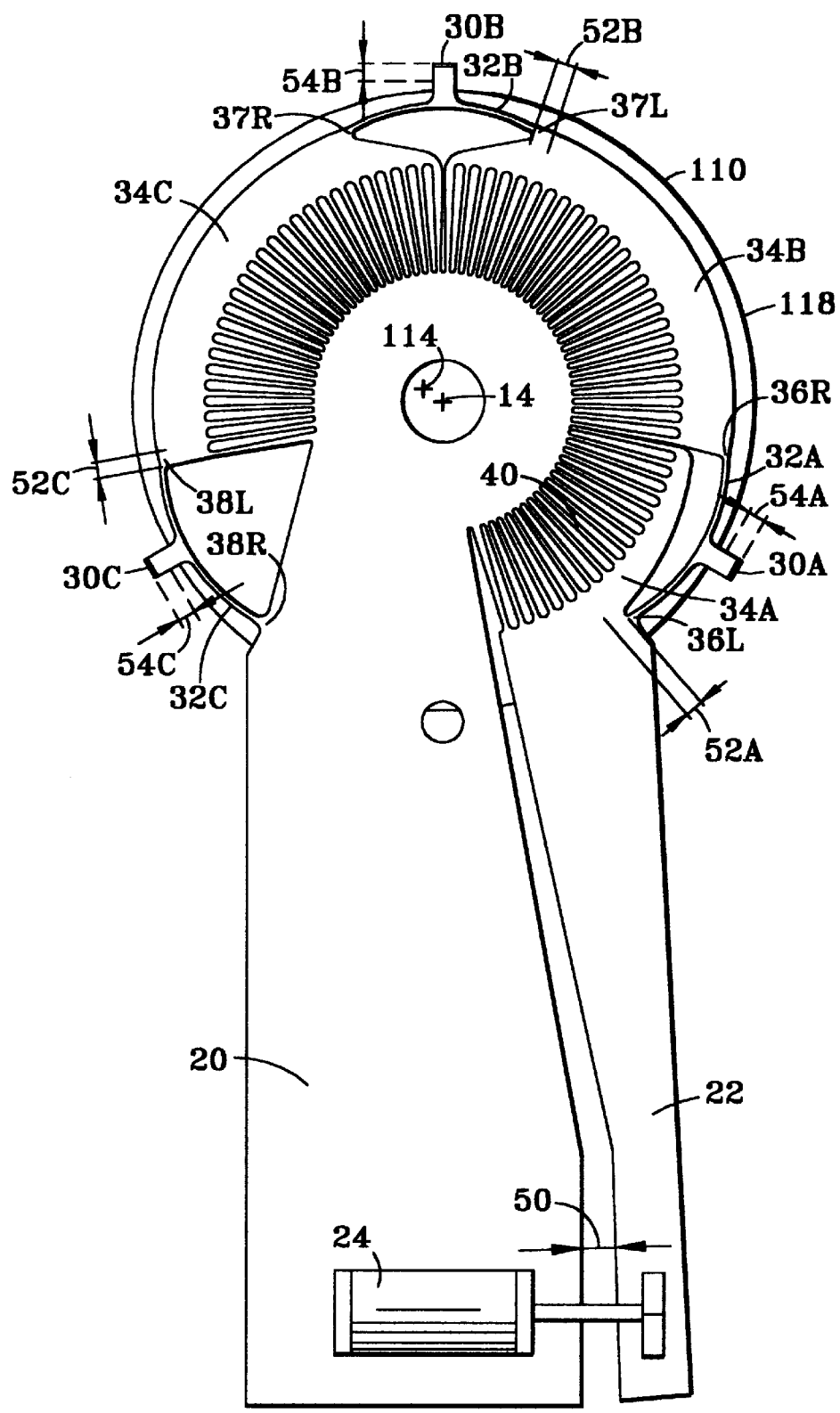
FIG. 2 is a plan view of the end-effector and workpiece wherein the workpiece is released by said end-effector, the end-effector being positioned to pick up or put down the workpiece.
Figure 3:
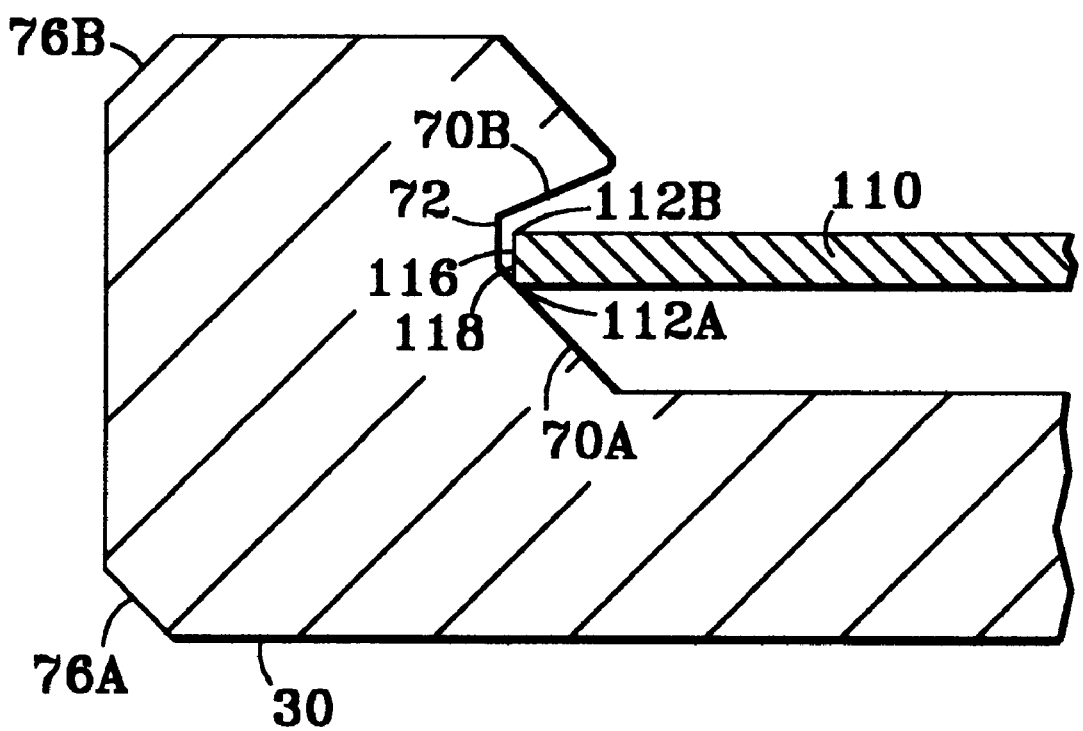
FIG. 3 is a sectional view showing in detail how a workpiece may be contacted by the end-effector as it is held thereby.

Referring to FIGS. 1 and 2, the invention embodies an end-effector holder 10 that holds a circular disc workpiece 110, for example, between a plurality of peripherally radially extending fingers 30, shown as three equilaterally circumferentially spaced finger holders, that receive and contact the workpiece. Referring to FIGS. 3–5, it can be seen that the fingers 30 are preferably recessed, receiving and contacting the workpiece along their interior surfaces 72. Different configurations are desirable for different applications as will be later discussed.

In the form shown in FIGS. 1 and 2, the holder 10 is a thin, planar flexible sheet formed with a substantially circular section C having a rectangular section R longitudinally extending (upwardly in the drawings) from a circumference region of the circular section C, as a one-piece structure. The circular section C itself is provided with a central circular disc portion D centered at 14, surrounded by a concentric annular ring made up of successively circumferentially spaced and separated sector segments 34A, B and C. These ring sectors are respectively supported by groups of radially extending rub spoke structural elements 40 interconnecting the respective ring sectors 34A, B and C with corresponding opposite circumferential portions of the central disc portion D, supporting the ring sectors in place therefrom.

Each of the annular ring sectors 34A, B and C is provided with respective external arcuate leaf springs 32 A, B and C mounted at their opposite ends between circumferentially spaced points of adjacent ring sectors, with an arcuate gap between the sectors and the leaf springs. Normally, the leaf springs form part of the circular perimeter, with the edge ends of adjacent ring sectors of reduced width to mount the leaf springs with their gaps. Thus, for example, leaf spring 32 A bridges an arcuate gap between its right-hand end point 36R on sector segment 34B and its left-hand sector connection end point at 36L; and leaf spring 32B spans from the left-hand end connection point 37L attached to sector segment 34B, and its right-hand end connection point 37R to sector segment 34C, etc. Each leaf spring 32A, B and C, moreover, is shown substantially centrally peripherally carrying corresponding holder fingers 30A, B and C radically protruding therefrom for receiving in recesses thereof corresponding edge regions of the circular workpiece 110, as before described.

Turning now to the integral longitudinally extending rectangular section R of the holder 10, it is shown in the form of a vertically longitudinally extending strip: a main fixed portion 20 extending from and integral with the circular section central disc D; and, at the side (right in FIGS. 1 and 2), a flexible lever portion 22, longitudinally slit from the portion 20, and bendably rotationally moveable in its plane by sidewise deflection at its free or outer end with respect to the fixed portion 20. The lever portion 22 is connected at its inner end with the adjacent ring sector 34A which it thus outwardly correspondingly deflects in opposition to the supporting action of the rib spokes 40 secured to the fixed central disc D. This rotational sidewise bending of the lever portion 22 perpendicularly radial direction from the fixed main portion 20, causes beam-like deflection of the rib spokes 40 and sector segments, outwardly deformingly stretching the leaf springs 32 A, B and C, (the sectors being mechanically coupled), increasing (or decreasing) the gap openings and thus correspondingly flexibly radially extending (or retracting) the fingers 30 A, B and C carried thereby, enabling adjustment and accommodation for insertion and removal of the workpieces.

The two adjacent ring sectors 34 B and C, are herein referred to and labeled as the top of the circular section C, with the longitudinal strip 20 and lever 22 referred to as extending from the bottom or lower portion of the circular section C. These adjacent ring sectors 34B and C thus serve as adjacent top quadrants of the circular sheet portion C and are shown subtending angles of about, and preferably slightly greater than 90°, and the third ring sector 34A subtends an angle less than 90°, serving to define one of the bottom or lower quadrants. As illustrated, a group of rib spokes 40 supports each of the top quadrant ring sectors from the corresponding top quadrants of the central circular disc portion D, and a further group of rib spokes similarly supports the third ring sector 34A from the corresponding lower quadrant of the central circular disc portion D.

The top leaf spring 32B therefore bridges the top quadrant ring sectors 34B and 34C from adjacent end points 37L and 37R, and the leaf spring 32A bridges the ring sector 34A from print 36L to point 36R of the to adjacent upper quadrant ring sector 34B. It will be observed that the inward or inner region of the lever 22 at 22' is connected to and serves as part of the ring sector 34A and the leaf spring end connection at 36L. The region of inward or inner extension of the fixed main strip 20 at 20' similarly serves as part of the ring sector of the outer lower quadrant, providing the end connection point 38R of the third leaf spring 32C, the other end of which connects at 38L to the adjacent upper quadrant ring sector 34C.

In experimental versions, for use with an exemplary eight inch diameter workpiece, a thin plastic sheet material of polymer resin epoxy was successfully employed wherein the central disc portion D had a diameter of about three inches, the annular ring of the ring sectors 34 B and C an inner diameter of about 2 ¾ inches and an outer diameter of about 3 ⅝ inches, flat rib spokes at about every 4–5° extending between the central disc portion and the ring sectors, and leaf springs about ¹⁄₁₆ inch wide and with gaps of the order of about ⅛ inch wide and about 3 inches arcuately long. The lever 22 and main longitudinal portion 20 extended about six inches from the circumference of the circular portion of the holder.

Figure 10:
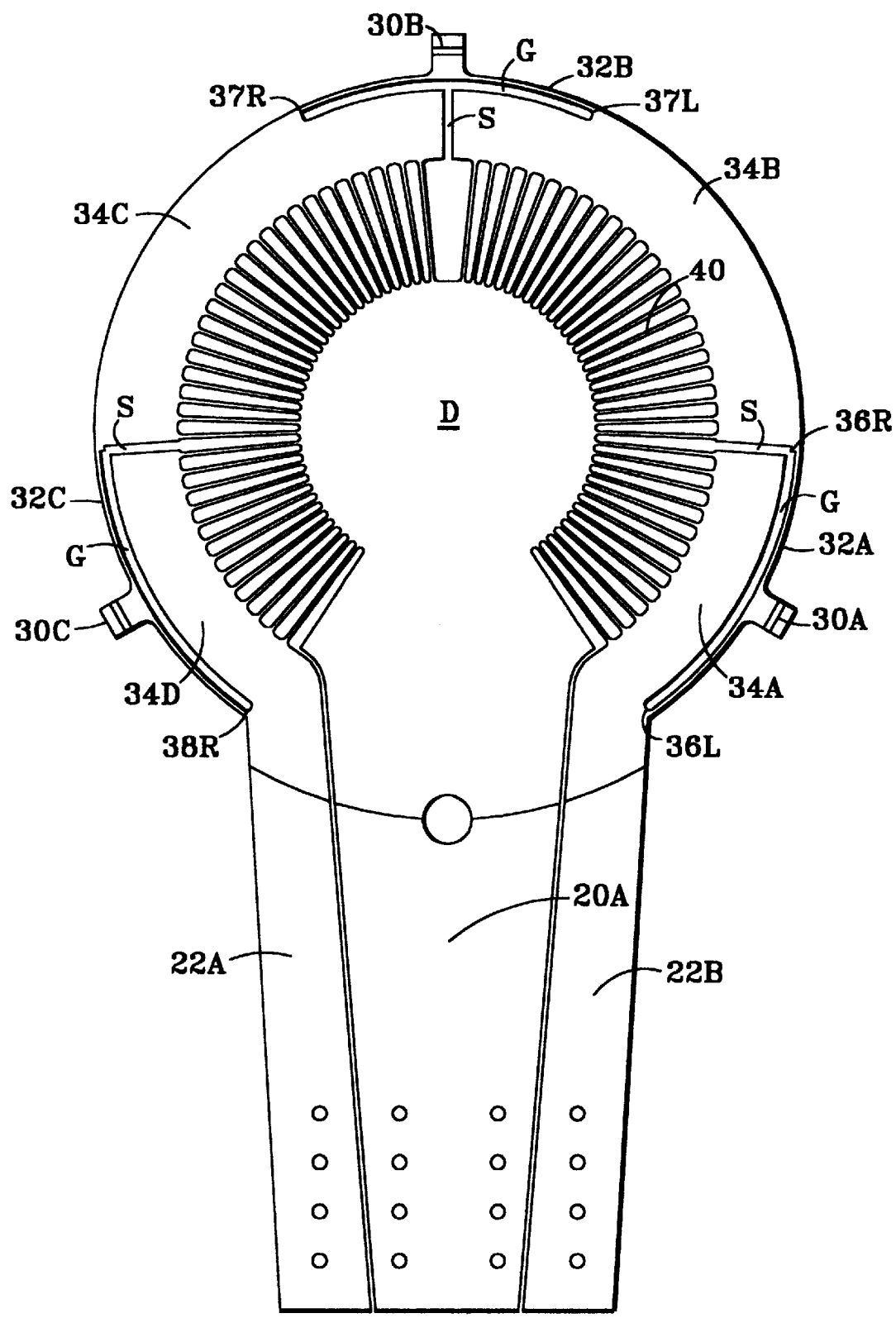
FIG. 10 is a view similar to FIG. 1 of a symmetrical opposite side lever embodiment.
Figure 11:
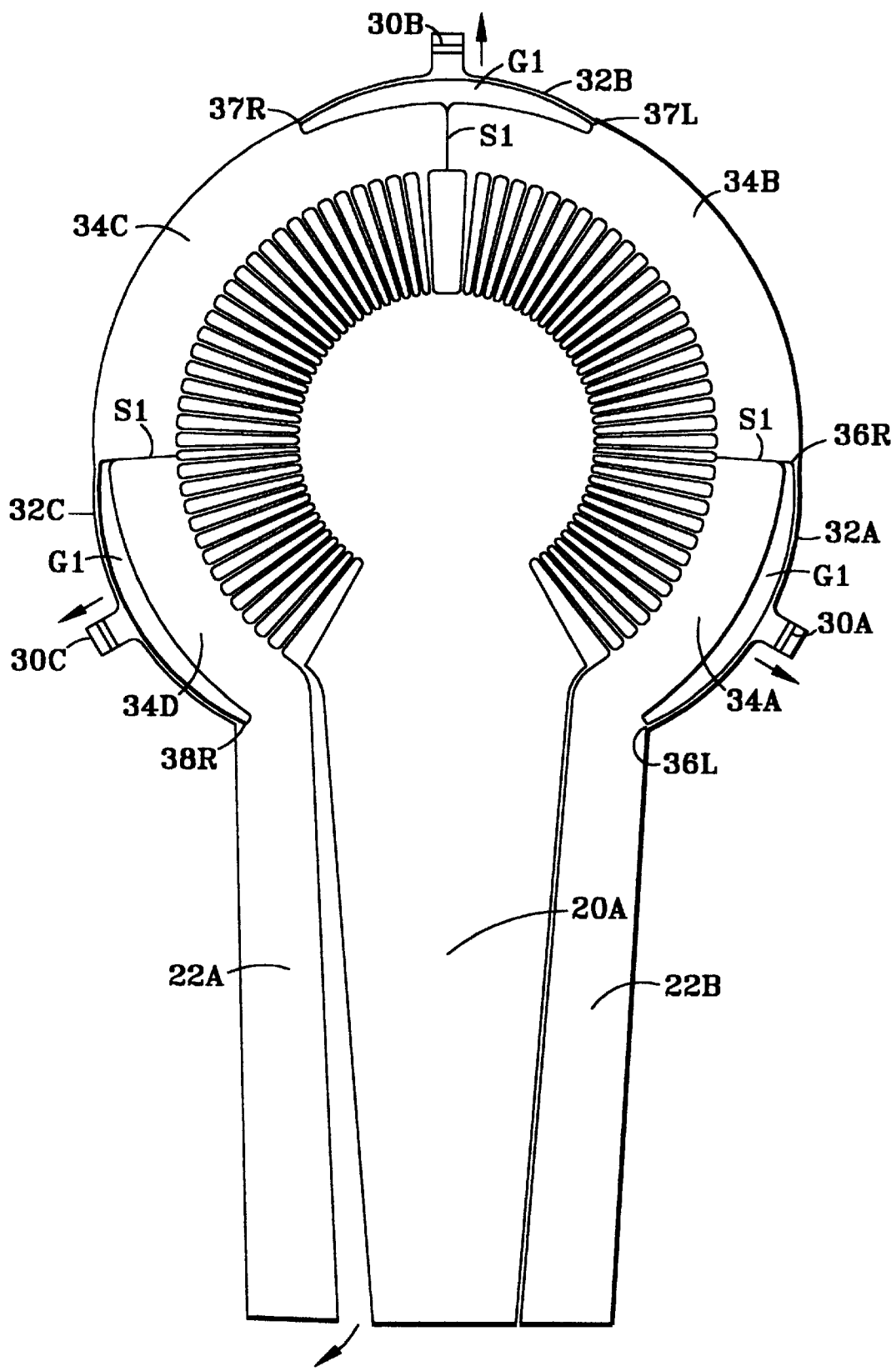
FIG. 11 is the view of FIG. 10 after the rotational deflection of the lever.

The operation of the invention may perhaps be better visualized by comparing FIGS. 10 and 1 1, before and after lever deflection. A pair of symmetrically disposed corresponding side levers 22A and 22B is shown in FIG. 10 and 11, respectively rotationally moving adjacent respective lower ring sectors 34D and 34A in this four-ring sector embodiment.

The normal circumferential positions and spacings S between thin successively separated ring sectors are shown in FIG. 10 with the normal leaf spring gaps G. Upon sidewise deflecting of one of the levers (shown as the left-hand lever 22A, corresponding to lever 20 of FIGS. 1 and 2, (though the right-hand lever 22B or both levers may also be actuated), as shown in FIG. 11, the attached ring sector 34D is bendingly limitedly rotated circumferentially upward to close the spacing at $S^1$ between ring sectors 34D and 34C and to bow the gap G outward as at $G^1$, extending the finger 30C radially outward, as indicated by the arrow. The mechanical support coupling of the rib structure closes the spacing at $S^1$ between the top adjacent edges of ring sectors 34C and 34B, bowing the leaf spring gap at $G^1$ and and similarly outwardly moving finger 34B; and the same action takes place for leaf spring 34A and finger 30A.

According to the invention, thus, a workpiece 110 is held by three or more fingers 30 A, B and C. which are caused to move in a radial direction by flexible rotational movement of the ends of leaf springs 32 A, B and C to which said fingers 30 A, B and C are attached. The plurality of ribs 40 aligned along the radial direction allows the ends of said leaf springs to move perpendicular to the radial direction while maintaining fixed the distance of said ends from the center. With the present invention, accordingly, all movement occurs through deflection rather than relative movement between sliding surfaces such as occurs in prior art linkages, gears, or pulleys. Several advantages are thereby obtained.

Because the end-effector is one piece, rather than multiple pieces which move relative to one other, the relative position of the surfaces which contact the workpiece can be precisely positioned during fabrication and can not become misaligned during operation. The position of the workpiece relative to known axes of the robot that is moving the workpiece, is accordingly repeatable to 0.05 millimeter or less. And this positional precision does not depend on mechanical linkages that are subject to wear or misalignment.

Particular advantages of the invention result from the way in which it may be fabricated. A novel aspect of the invention is that the complete end-effector is preferably one piece of material and therefore not subject to mechanical variation that occurs when assembling parts that must move relative to one other. The invention lends itself to two primary methods of fabrication. Machining from metals can be used for applications that require repeatable workpiece location to within less than 0.1 millimeter. Injection molding can be used for applications that do not require so precise a positioning repeatability, and this may be particularly advantageous for low cost applications or for applications where metal parts cannot be used.

Fabrication by machining allows all workpiece contacting surfaces to be cut simultaneously from a solid block of metal. The relative position of the surfaces which position the wafer can therefore be fabricated to within 0.05 millimeter using standard machining equipment, and to within 0.01 millimeter using high precision equipment. Machining of the end-effector final shape, the ribs and springs, is preferably accomplished with electric discharge machining which does not distort the metal or alter the relative position of the contacting surfaces. Unlike prior art systems, the relative position of the contacting surfaces is also not then subject to subsequent tolerance stack up and repeatability that occurs when assembling multiple parts that must move relative to one other.

Fabrication by injection molding, as above discussed, is possible because the invention can, as before stated, be fabricated as substantially one piece. Prior art systems require multiple pieces in an assembly wherein the pieces move relative to one other. Holding tight tolerances among plastic parts, of prior art systems, moving relative to one other, is not commercially feasible in an assembly that must hold tolerances for millions of cycles of actuation.

Returning now to further explanation of the operation of the embodiment of the invention described in connection with FIGS. 1 and 2, arrows are shown in FIG. 2 more clearly to explain the controlled radial motion (54) of the fingers 30 relative to the center 14 which provides for the enlarging of the distance between the fingers so that the workpiece may be inserted or removed from the space defined by the interior surfaces of the fingers 30. Motion (50) between the fixed holder member 20 and the moving member 22 may, in practice, be provided by an actuator 24 such as a solenoid or pneumatic piston, well known to those versed in the art, flexibly extending the lever 22 sidewise, rotationally outwardly. As the moving lever member 22 is pivoted sidewise away from the fixed member 20, it causes ring sector segment 34A limitedly to move (52A) perpendicularly to the plurality of ribs 40 that define its position relative to the fixed member 20. During this motion, the ribs 40 deflect perpendicularly to their axis, which is aligned along a radius extending from the center 14. This, as before described, may be considered as deflection of a beam, which is attached at both ends. This moves the left end 36L of leaf spring 32A, for example, toward its right end 36R, distortingly expanding the gap under the leaf spring. As the leaf spring 32A is compressed along its axis by this relative motion, it deflects or bows (54A) radially away. from the center 14, moving the finger 30A similarly away from the center 14.

As is evident from FIGS. 1 and 2, in view of the mechanical coupling of the system, this type of motion is repeated for all of the plurality of fingers 30, leaf springs 32, and sector segments 34. Motion (52B) of the right end 36R of leaf spring 32A, causes as another example, segment 34B to start to rotate around center 14 and moves the left end 37L of leaf spring 32B, thereby compressing it and causing finger 30B to extend (54B) radially away from the center 14. Compression of leaf spring 32B, moreover, causes motion (52C) of the right end 37R of leaf spring 32B, causing sector segment 34C to start to rotate circumferentially limitedly around the center 14, and moves the left end 38L of leaf spring 32C, thereby compressingly distorting it and causing finger 30C to extend moreover causes motion (52C) of the right end 37R of leaf spring 32B, causing sector segment 34C to start to rotate circumferentially limitedly around the center 14, and moves the left end 38L of leaf spring 32C, thereby compressingly distorting it and causing finger 30C to extend (54C) radially away from said center 14. The right end 38R of leaf spring 32C is fixed to the fixed portion 20 and does not move. A particular advantage of the invention is that the spring force of the leaf springs 32 causes the workpiece to remain securely gripped when the actuator 24 is in an off position. Hence, in the event of a power failure, or other unplanned failure of the actuator, the workpiece is still securely held.

The force required to displace the moving lever member 22 relative to the fixed member 20 is thus used to deflect a series of springs which are mechanically coupled in this structure. Each of the three leaf springs 32A, 30B and 30C, as well as the ribs of the plurality of ribs 40 attached to each of the perimeter or sector segments 34A, 34B, and 34C, are deflected when the lever is actuated (50). It can be seen that more force is applied to the first leaf spring 32A than the second leaf spring 32B by an amount equal to the spring force required to deflect the ribs on segment 34B. The relative thickness of the leaf springs 30A, 30B and 30C may be adjusted so that their respective deflections (54A, 54B, 54C) are equal. It can be seen by those skilled in the art that a similar pattern may be repeated with four, five, or more springs segments, as well.

Referring again to FIG. 3, it can be seen that the workpiece is captured at its very edges 112A, 112B, with the workpiece weight supported by contact between workpiece edge 112A and end-effector contact surface 70A. Were the end-effector holder to be oriented such that the gravitational force were reversed, moreover, the workpiece weight would be supported by contact between workpiece edge 112B and end-effector contact surface 70B. To ensure the workpiece is never jammed into the end-effector, the minimum distance between the end-effector surfaces 70A and 70B is fabricated in such a manner as to ensure that it is always greater than the maximum workpiece thickness.

As is also indicated in FIG. 2, the workpiece center 114 and the end-effector center 14 are not necessarily aligned prior to end-effector 10 grasping the workpiece 110. As the actuator movement (50) is reduced back to the zero, the contacting surfaces 70A, 70B and radial contacting surface 72 will push the workpiece such that its center 114 becomes aligned with the center 14. The end-effector perimeter surface 72 is preferably fabricated in such a manner as to ensure that is smaller than the average workpiece perimeter surface 116 by approximately 0.5 millimeter. This causes the leaf springs 32 to apply a slight radial pressure to the workpiece 110 when the end-effector is in the closed position (movement 50 returned to zero). The perimeter surface 72 is constructed to extend along the workpiece perimeter surface 116 substantially more than typical manufacturing variations 118 in the shape of said surface 116; for example, the width of an alignment notch in a silicon wafer. This ensures that such variations do not effect the precision of alignment between workpiece center 114 and holder center 14.

Figure 4A:
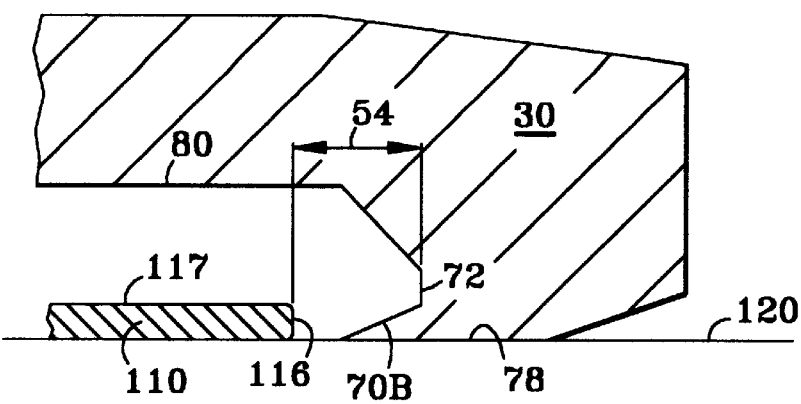
FIGS. 4A–4C are sectional views showing in detail how a workpiece may be contacted by the end-effector as it is being lifted off a substantially flat surface.
Figure 4B:
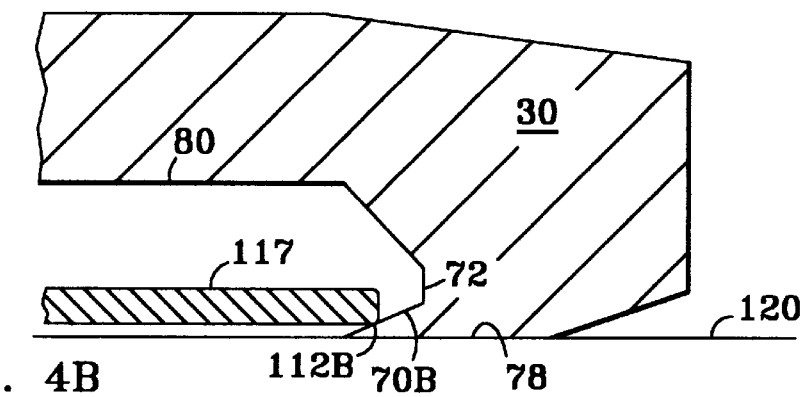
Figure 4C:
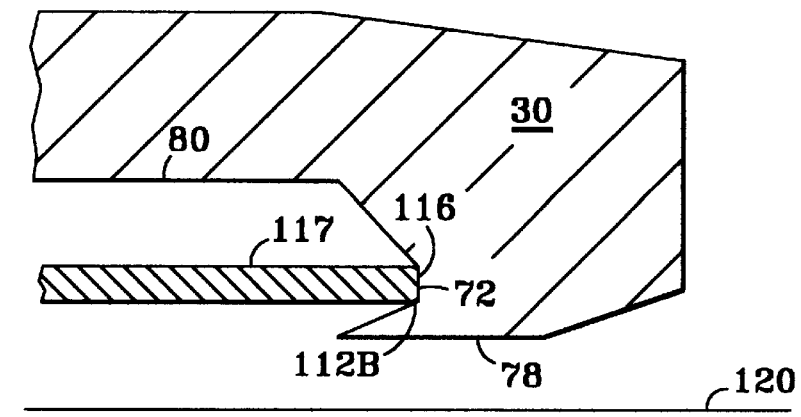
Figure 5:
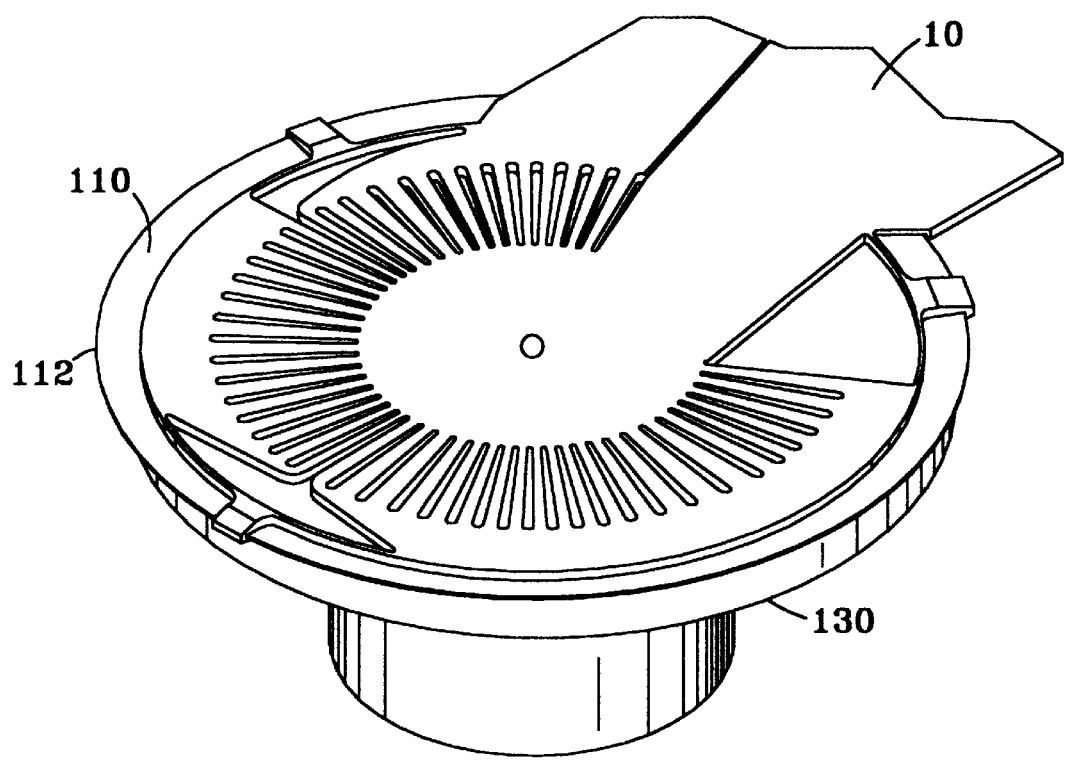
FIG. 5 is a similar view illustrating how a workpiece may be contacted by the end-effector as it is being lifted off a pedestal in a manner that avoids contact with the top side of the workpiece.

Referring next to FIGS. 4A, 4B, 4C, the manner in which the invention can be readily used to pick-up a workpiece from a substantially flat surface is demonstrated. FIG. 4A shows a close-up view of the end-effector aligned parallel to the workpiece resting surface 120 and contacting said surface with surface alignment guides 78. The fingers 30 are in an actuated position so that there is an appropriate gap 54 to provide clearance between the workpiece perimeter 116 and the contact surface 70B. FIG. 4B shows the contact surface 70B beginning to engage and lift the workpiece by its edge 112B. FIG. 4C shows the filly engaged position such that the workpiece perimeter surface 116 is in contact with the end-effector interior perimeter surface 72 and the end-effector is lifted away from the workpiece resting surface 120. The workpiece top surface 117 is never contacted by the end-effector interior surface 80, and consequently there is no chance of damage to the critical part of the workpiece. It is further of particular advantage that surfaces 72, 78 and 80 may be machined simultaneously on the plurality of fingers 30 may be fabricated from a sturdy solid block of material prior to cutting of the ribs 40, the leaf springs 32, or the fingers 30. Because the invention is substantially one piece, furthermore, there is no degradation of the alignment of the contact surfaces during an assembly operation. This allows for tolerances of less than 0.02 millimeters to be held on the position of these contacting surfaces.

In FIG. 5, it can be seen how the holder 10 of the invention can be used to pick-up a work-piece 110 from a pedestal 130 like a spin-chuck. As shown in FIGS. 3 and 4, the topside of the work-piece 117 is not contacted by the interior 80 of the holder. Instead, the work-piece is only contacted at its edges 112.

Figure 6:
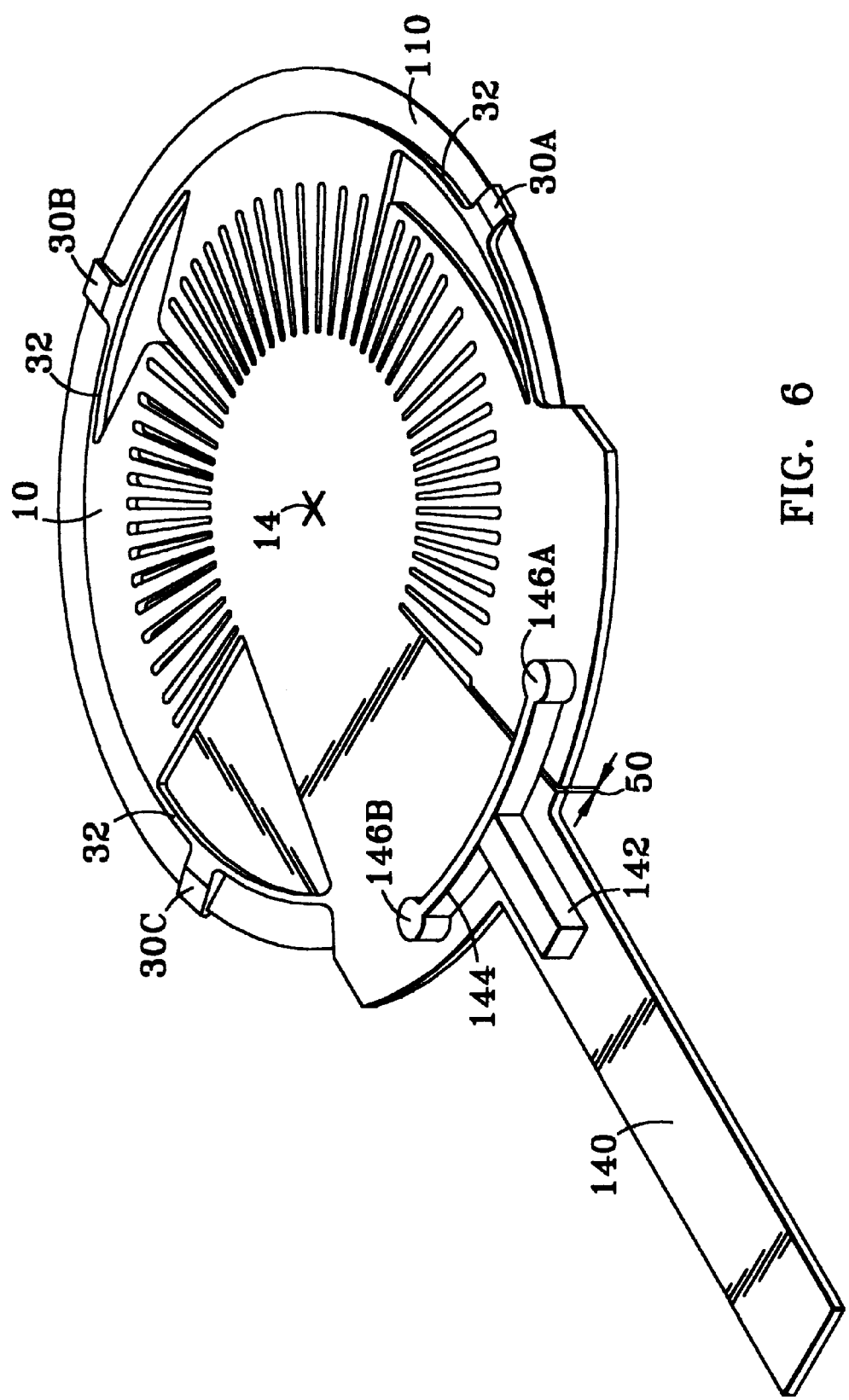
FIG. 6 is an assembly view showing an embodiment of the end-effector particularly useful for manual transport of workpieces.

FIG. 6 illustrates a further embodiment of the invention that may be particularly be used for manually grasping and transporting workpieces. A person may grasp the end-effector holder 10 by a handle 140 in such a manner that a plunger 142 is readily manipulated by the operator's thumb. Movement of the plunger 142 toward the center 14 causes the leaf spring 144 to deflect in such a manner as to increase the distance between its ends 146A and 146B, thereby widening the gap 50 and causing the fingers 30 to extend radially as previously described. A particular advantage of the invention is that the spring force of the leaf springs 32 and 144 causes the workpiece to be securely gripped when the plunger 142 is released. No power or applied vacuum need thus be maintained to the end-effector while holding and transporting a workpiece.

Figure 7:
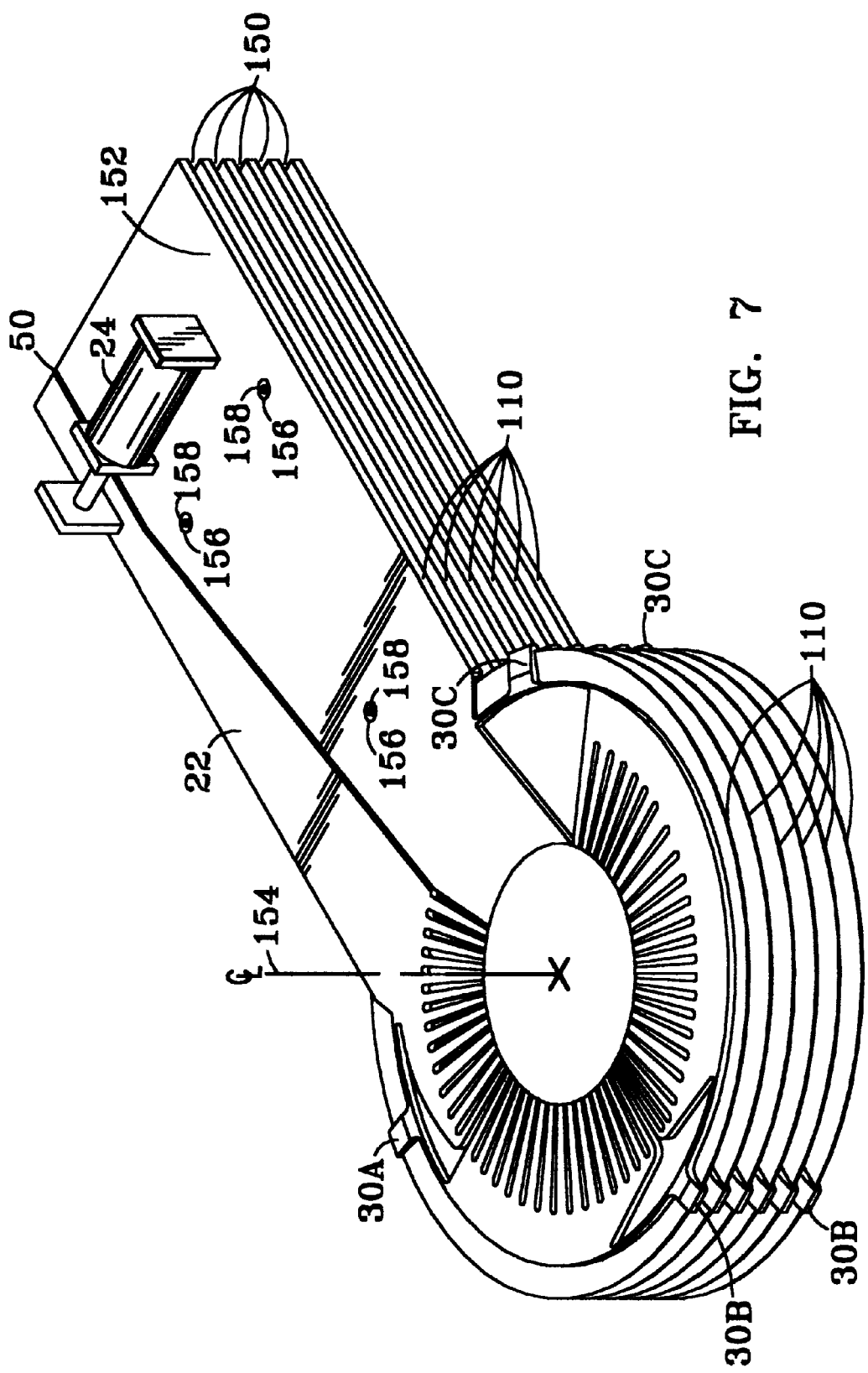
FIG. 7 is an assembly view showing an embodiment of the end-effector useful for simultaneous pick-up, transport, and drop-off of a plurality of workpieces.

FIG. 7 shows an embodiment of the invention that may be used for transporting a plurality of workpieces simultaneously. In this embodiment, six end-effector holders 10 of the invention are fixed together at specific distance by separator blocks 150. Similarly, the moving segments 22 of each end-effector are fixed together so that the actuator 24 moves them all simultaneously. Consequently, the assembly 152, with fingers 30 in a radially expanded position as previously discussed, can be inserted between workpieces 110 into a workpiece holding cassette (not shown), and lowered such that the contacting surfaces are appropriately aligned with the workpieces 110. Finally, the actuator 24 is de-activated such that the fingers 30 contract radially and grip all six wafers in a single motion. The assembly 152 is then extracted from the cassette and transports the workpieces to a process station requiring multiple parallel workpieces; a diffusion tube rack for example. Workpieces are dropped off in the reverse sequence in which they were picked up.

A particular advantage of the invention in this embodiment is that all workpieces may be brought onto the same centerline 154 with very high precision; i.e. all workpieces can be centered to within 0.06 millimeters of the assembly centerline 154. As previously discussed, the contact surfaces on each end-effector holder 10 can be precision-machined along with alignments holes 156 that are used to align on alignment pins 158 to make the assembly 152. This minimal number of components and alignment surfaces ensures precision pick-up and placement of all workpieces.

Figure 8:
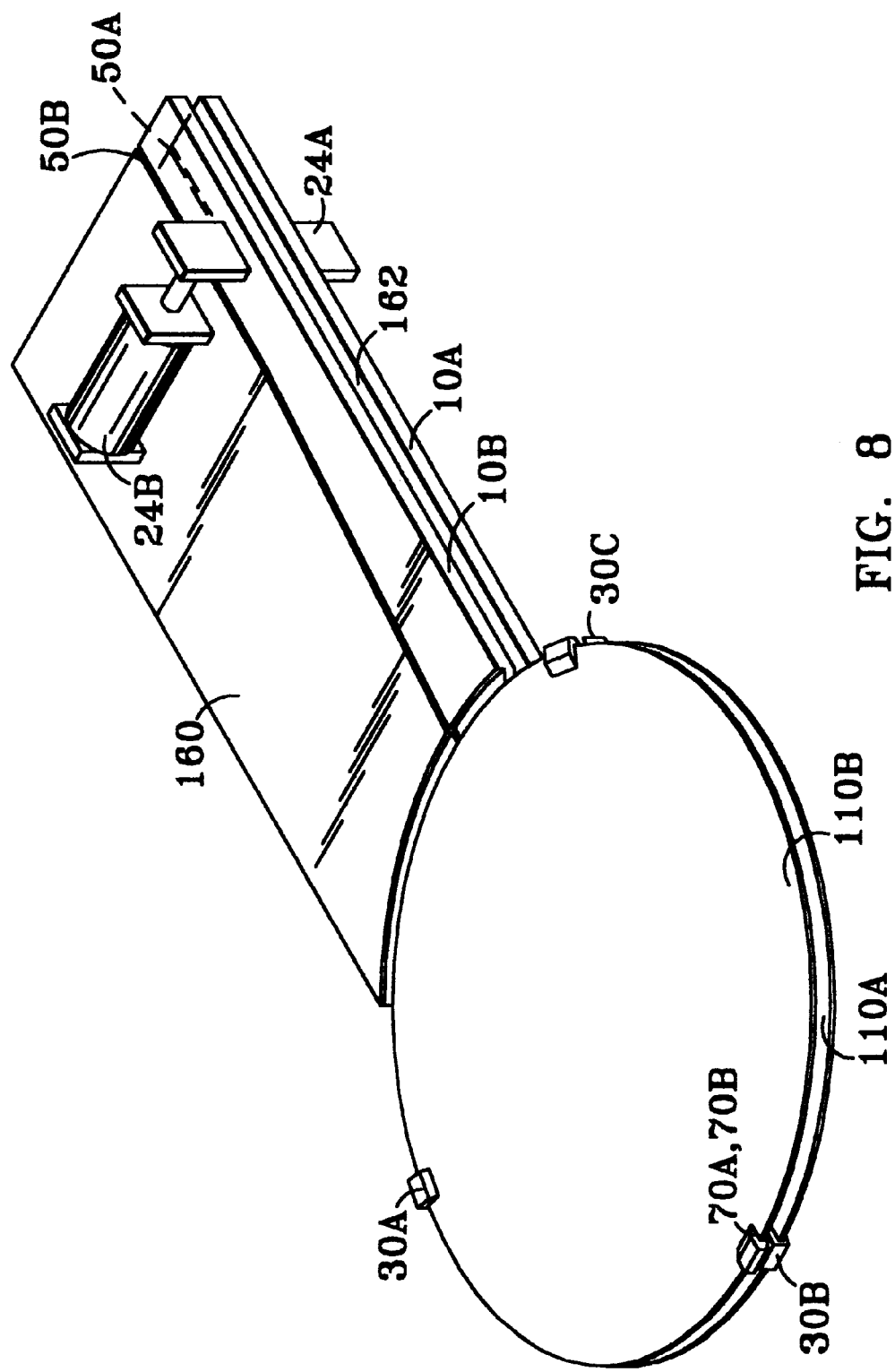
FIG. 8 is a similar view illustrating the separate pick-up simultaneous transport, and separate drop-off of two workpieces.

In FIG. 8, an embodiment is illustrated that is particularly useful for transporting two workpieces simultaneously while picking up each workpiece individually. This is useful for optimizing robot travel in an automated process station since workpieces may be physically located in proximity but require different pick-up and delivery schedules. The assembly 160 is comprised of two end-effectors 10A and 10B that are attached together by a known means such as welding, such that they hold two-workpieces 110A, 110B. A clearance space 162 allows each side of the assembly 160 to be separately actuated by an actuator 24A, 24B. A particular advantage of this assembly is that during fabrication, the critical alignment surfaces are machined prior to assembly of 10A and 10B, and the complex shapes of ribs 40, leaf springs 32, and fingers 30 may be electric-discharge machined after assembly.

Figure 9:
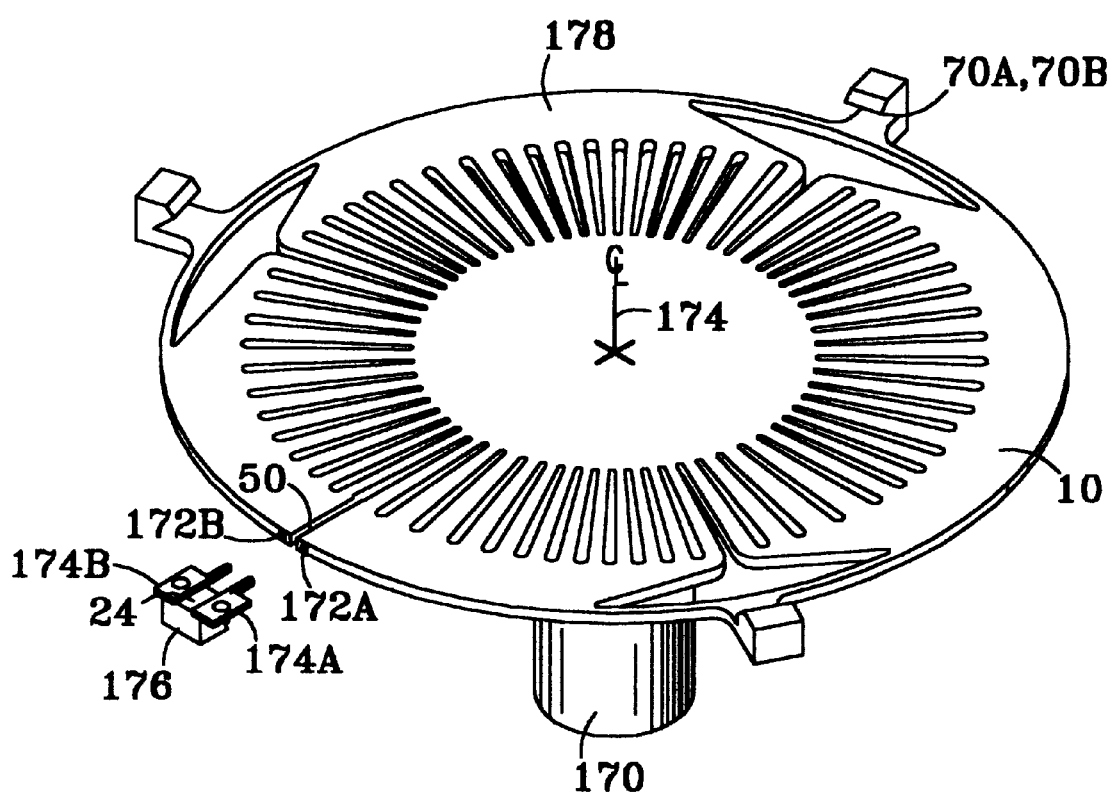
FIG. 9 is an assembly view showing holding of a workpiece while rotating the workpiece.

FIG. 9 shows an embodiment of the invention that may be used as a spin chuck for rotating a workpiece at a substantially high speed, such as during spin-coating of photo-resist on semiconductor wafers, or similar applications. The same type of earlier described workpiece gripping mechanism may be used.

A shaft 170 is part of the bottom side of the rotating workpiece chuck 178. Actuation is provided by actuator engagement arms 174A and 174B, which are inserted into actuator engagement hole arms 172A and 172B when the chuck 178 is not moving. An actuator carriage 176 then pulls the engagement arms 174A and B out of the chuck 172A and B prior to rotation. A particular advantage of the invention in this embodiment is that the contact surfaces 70A, 70B and 172A and B are machined while the part is being held by the shaft 170, thereby ensuring very high precision centering of the workpiece to the axis of rotation 174.

Though the invention has been described in connection with its preferred and perhaps optimal application to thin circular discs and the like, it is clear that other-shaped workpieces may also be usefully held in accordance with the principles of the invention; as well. Further modifications will also occur to those skilled in this art, and such are considered to fall within the spirit and scope of the invention as defined in the appended claims.

What is claimed is:

1. A holder for a thin, planar circular workpiece comprising a substantially thin and flexible substantially planar circular sheet having a central circular disc portion surrounded by a concentric annular ring portion, with the ring portion being segmented into successive separated circumferentially spaced ring sectors; structural supporting means interconnecting the respective ring sectors with the corresponding circumferential sectors of the central disc portion for supporting the same in place therefrom; the ring sectors being peripherally provided with external arcuate leaf springs circumferentially bridging spaced points of adjacent ring sectors to which the ends of the leaf springs are respectively connected, and with an arcuate gap between the sectors and the leaf springs; each leaf spring intermediately carrying a radially protruding holder finger for receiving and contacting an edge region of a circular workpiece to be placed on the holder; and means operable while the central disc portion is held fixed, for flexibly rotationally bending the ring sector to move limitedly circumferentially relative to the central disc portion to cause beam-like deflections of the structural means and ring sectors that correspondingly radially distort the leaf springs and bow their gaps, radially extending and retracting the positions of the fingers carried by the leaf springs to enable insertion and removal of the workpiece.

2. The holder of claim 1 wherein the rotational movement of one ring sector is mechanically coupled by the deflection of the structural supporting means simultaneously to bow adjacent ring sector leaf springs.

3. The holder of claim 1 wherein the structural supporting means comprises radially extending groups of radial rib spokes.

4. The holder of claim 3 wherein at least three substantially equilaterally circumferentially disposed leaf springs and fingers are provided cooperative with at least three ring sectors.

5. The holder of claim 4 wherein two adjacent ring sectors each subtend angles of about and preferably slightly greater than 90°, serving as adjacent top quadrants of the circular sheet portion, and a third ring sector subtends an angle of less than 90° of a lower quadrant.

6. The holder of claim 5 wherein a group of rib spokes supports each of the top quadrant ring sectors from the corresponding top quadrants of the central circular disc portion, and a further group of rib spokes supports the third ring sector from a corresponding lower quadrant of the central circular disc portion.

7. The holder of claim 6 wherein a top leaf spring bridges the top quadrant ring sectors, and a further leaf spring bridges said third ring sector and an adjacent point of the upper quadrant ring sector.

8. The holder of claim 7 wherein the bending means comprises a longitudinal lever inwardly connected to said third ring sector and disposed at a side of a fixed main longitudinal strip integrally connected with said central disc portion and longitudinally separated therefrom by a longitudinal slit to enable flexible rotational bending of the lever sidewise of the main strip and central portion; and wherein the further leaf spring is connected between a point of such inward lever connected to said third ring sector and said adjacent upper quadrant ring sector.

9. The holder of claim 8 wherein the region of inward connection of the main longitudinal strip to said central disc portion serves also as the other lower quadrant ring sector, with a third leaf spring bridging from that region to a point of the adjacent upper quadrant ring sector.

10. The holder of claim 8 wherein the bending means comprises actuator means connected, when operable, to effect limited rotational bending movement of at least one of the ring sectors.

11. The holder of claim 10 wherein the actuator means is mounted upon the fixed main strip to move the levers sidewise therefrom.

12. The holder of claim 3 wherein the groups of the rib spokes have rib spacings of about 4° to 5°.

13. The holder of claim 1 wherein the bending means comprises a longitudinal strip of the sheet connected to an adjacent ring sector and extending longitudinally outward from the circular sheet to serve as an integral lever, flexibly rotationally bendable sidewise relative to the fixed central disc portion.

14. The holder of claim 13 wherein said lever is disposed at a side of a fixed main longitudinal strip integrally connected with said central disc portion and longitudinally separated therefrom by a longitudinal slit to enable flexible sidewise rotational bending of the lever with support to the fixed main strip and central disc portion.

15. The holder of claim 14 wherein a second similar lever is provided substantially symmetrically disposed along the other side of the fixed main longitudinal strip, connected to an adjacent ring sector on such other side.

16. The holder of claim 15 wherein four ring sectors are provided, with two adjacent ring sectors each subtending angles of about and preferably slightly greater than 90°, serving as adjacent top quadrants with a top leaf spring bridging the top quadrant ring sectors; and the other two ring sectors subtending angles of less than 90° in the adjacent lower quadrants, each having a leaf spring bridging the respective lower quadrants and adjacent points of the respective upper quadrant ring sectors.

17. The holder of claim 16 wherein a group of rib spokes supports each of the top quadrant ring sectors from the corresponding top quadrants of the central disc portion, and a further group of such rib spokes supports each of the lower quadrant ring sectors from the corresponding lower quadrants of the central disc portion.

18. The holder of claim 17 wherein the bending means comprises a pair of longitudinal levers respectively inwardly connected to the lower quadrant ring sectors on opposite sides of a fixed main longitudinal strip that is integrally connected with said central disc portion, and longitudinally separated therefrom by longitudinal slits to enable flexible sidewise rotational bending of the levers with respect to the main strip and central disc portion.

19. The holder of claim 13 wherein the actuator means is mounted upon the fixed main strip to move the levers sidewise therefrom.

20. The holder of claim 1 wherein the annular ring formed by the successive spaced ring sectors has a circular outer perimeter, and the leaf springs are formed as part of the perimeter with their gaps formed by reduced width end edges of the adjacent ring sectors.

21. A method of providing adjustment in the receiving and holding of thin, planar circular workpieces, that comprises, providing a central thin circular disc upon which a workpiece of greater dimensions is to be positioned, and fixing disc against movement; mechanically supporting a concentric annular ring of segmented successive separated circumferentially spaced thin flexible ring sectors in place about the disc and in the plane thereof, with the support being rigid in the radial direction but flexibly tangentially perpendicular thereto; providing ring sectors with external arcuate leaf springs intermediately carrying radially protruding fingers for holding the edges of a workpiece; and circumferentially bridging spaced points of adjacent ring sectors with gaps therebetween; and flexibly rotationally bending at least one ring sector to cause limited circumferential moving thereof about the fixed central disc to cause corresponding radial distortion of the corresponding leaf spring and bowing of its gap, thereby extending or retracting the positions of the fingers caused by the leaf springs to enable insertion and removal of the workpiece.

22. The method of claim 21 wherein the mechanical supporting couples the limited rotational movement of said at least one ring sector to adjacent ring sectors and their respective leaf springs.

23. The method of claim 21 wherein the mechanical supporting is effected by groups of radial rib spokes connecting the ring sectors with corresponding sectors of the central disc.

24. The method of claim 23 wherein the bending is effected by providing a flexible lever connected to said ring segment, and moving the lever rotationally sidewise of said central disc.

25. The method of claim 24 wherein the disc, ring sectors, leaf springs, fingers and lever are all formed of an integral thin sheet.

* * * * *